United States Patent [19]

Zommer

[11] Patent Number: 5,486,715
[45] Date of Patent: Jan. 23, 1996

[54] HIGH FREQUENCY MOS DEVICE

[75] Inventor: Nathan Zommer, Los Altos, Calif.

[73] Assignee: IXYS Corporation, Santa Clara, Calif.

[21] Appl. No.: 347,787

[22] Filed: Dec. 1, 1994

Related U.S. Application Data

[63] Continuation of Ser. No. 137,823, Oct. 15, 1993, abandoned.
[51] Int. Cl.[6] ......................... H01L 29/78; H01L 21/265
[52] U.S. Cl. .................. 257/341; 257/342; 257/401; 257/750; 257/754; 257/755; 257/758; 257/412; 257/413; 437/48; 437/193; 437/194; 437/233
[58] Field of Search ................................. 257/341, 342, 257/401, 750, 754, 755, 758, 412, 413; 437/48, 193, 194, 233

[56] References Cited

U.S. PATENT DOCUMENTS 5,119,153  6/1992  Korman et al. .................. 257/341
5,164,802  11/1992  Jones et al. .................... 257/341

*Primary Examiner*—Edward Wojciechowicz
*Attorney, Agent, or Firm*—Townsend and Townsend and Crew

[57] ABSTRACT

A high frequency power MOS device (90) that is built by MOS technology having high speed switching capability. The device provides improved turn-on and turn-off capabilities by providing gate interconnects comprising substantially metallization, thereby reducing parasitic resistance and capacitance. The device may be fabricated by a MOS process relying upon a dual metallization layer (127, 133) for forming the interconnects. The dual metallization layer has substantially less resistivity than the conventional polysilicon and metallization layer interconnect.

30 Claims, 4 Drawing Sheets

5,486,715

HIGH FREQUENCY MOS DEVICE

This is a continuation of application Ser. No. 08/137,823 filed Oct. 15, 1993, now abandoned.

BACKGROUND OF THE INVENTION

The present invention relates to semiconductor switching devices known as power MOS or MOSFET devices.

Power MOSFETs are voltage-controlled devices which require only a small input current for switching. In comparison to a conventional bipolar transistor device, switching speed is higher, and therefore switching times are faster. As such, these devices are finding increasing applications in low-power, high-frequency converters.

Industry currently provides two general types of MOSFETs including a depletion mode and an enhancement mode device. These two types of MOSFETs may be formed by either n-channel or p-channel technology, or the like. However, all MOSFETs characteristically possess three terminals including a gate, drain, and source. The gate is always isolated from a channel region by a thin oxide layer (typically between 200 to 1200 angstroms). A thinner oxide layer usually requires less voltage to turn-on the device.

As for gate construction, commercial devices were first developed with a metal gate (i.e., aluminum). From a circuit perspective, it suffers severe drawbacks. In particular, the metal gated device requires a higher threshold voltage to turn-on the device than other MOS technologies, thereby resulting in a higher power requirement.

Another drawback with the metal gated device is its operating speed. Operating speed is a function of time required to turn-on and/or turn-off the device. Its effect over the entire MOS circuit is termed access time. The metal gated device inherently produces a structure where the metal gated region overlaps the adjacent source and/or drain regions. This gate overlap gives rise to a parasitic capacitance, thereby impairing device access time, operating speed, and device turn-on and/or turn-off.

Therefore, polysilicon gated technology was introduced to reduce the problems inherent with the metal gated device. The polysilicon gated devices provide lower threshold voltages and faster switching characteristics than their metal gated predecessors. Parasitic capacitance also decreases through a unique fabrication sequence which reduces the gate overlap. This unique fabrication sequence produces a self-aligned gate by forming the gate region before the source and drain diffusions. Currently, industry provides state-of-art power MOS devices with the polysilicon gated material.

However, even state-of-art polysilicon gated devices inherently possess severe limitations with the faster switching characteristics (typically 1 MHz to 900 MHz) required by today's technologies. The polysilicon gate typically has a resistance of about 20 ohms/SQ and includes portions overlying a channel region and field region. Each gate also has significant capacitance between it and its corresponding MOS source and/or drain regions. Both the resistance (R) and capacitance (C) are "parasitic" to the active circuit of the device. Since a polysilicon gated integrated circuit relies predominately upon the polysilicon gate layer to provide the interconnections between the gates within each active device, the parasitic factors combine producing a gate bus having a relatively high RC per unit length of gate. This high RC value causes significant delays during device turn-on and/or turn-off. Resistance R also contributes to energy loss via heat dissipation. During high frequency switching (typically 1 MHz to 900 MHz), the combination of these losses lead to excessive heating, thereby limiting the useful frequency range of the device.

SUMMARY OF THE INVENTION

The present invention provides a superior high frequency power MOS device with improved switching capabilities made by reducing the degrading effects of parasitic resistance and capacitance within the gate region of the prior art. The present invention achieves these benefits in the context of known process technology.

The improved device provides an interconnection for propagating device turn-on and/or turn-off signals, comprising substantially metallization over a polysilicon gated region. This polysilicon gated region includes portions overlying a channel region and field or non-active region. Since the signals within the improved device propagate primarily through metallization instead of polysilicon, resistance R and capacitance C of the prior art are reduced. By reducing resistance R and capacitance C, the RC factor of the prior art also decreases, thereby improving the switching characteristics of the device.

An embodiment of the improved device includes a chip having a first and second metallization layer with at least an insulating layer sandwiched in between. The first metallization layer is overlying the gate polysilicon layer comprising a layer overlying a channel region and field or non-active region. The gate polysilicon layer in combination with the first metallization layer provide a plurality of common connections between the active devices. The second metallization layer comprise a gate pad interconnected to a plurality of bus lines. The first and second metallization layers are connected to each other through a contact opening within at least the insulating layer. Thus, the improved device provides a medium comprising substantially metallization for signal propagation. In particular, the signal activating the device propagates from the gate pad through the gate bus (or second metallization), and then through the first metallization layer to turn-on and/or turn-off the device. This embodiment reduces resistance R and capacitance C by relying upon metallization interconnects instead of polysilicon, and therefore reduces the RC factor of the prior art device. As such, the improved device provides improved switching capabilities. The improved device also generates less heat, and therefore operates over a broader range of frequencies (typically from 1 MHz to 900 MHz).

However, a further understanding of the nature and advantages of the present invention may be realized by reference to the latter portions of the specification and attached drawings.

DESCRIPTION OF THE SPECIFIC EMBODIMENT

Prior Art Power MOSFETs

Figure 1A:
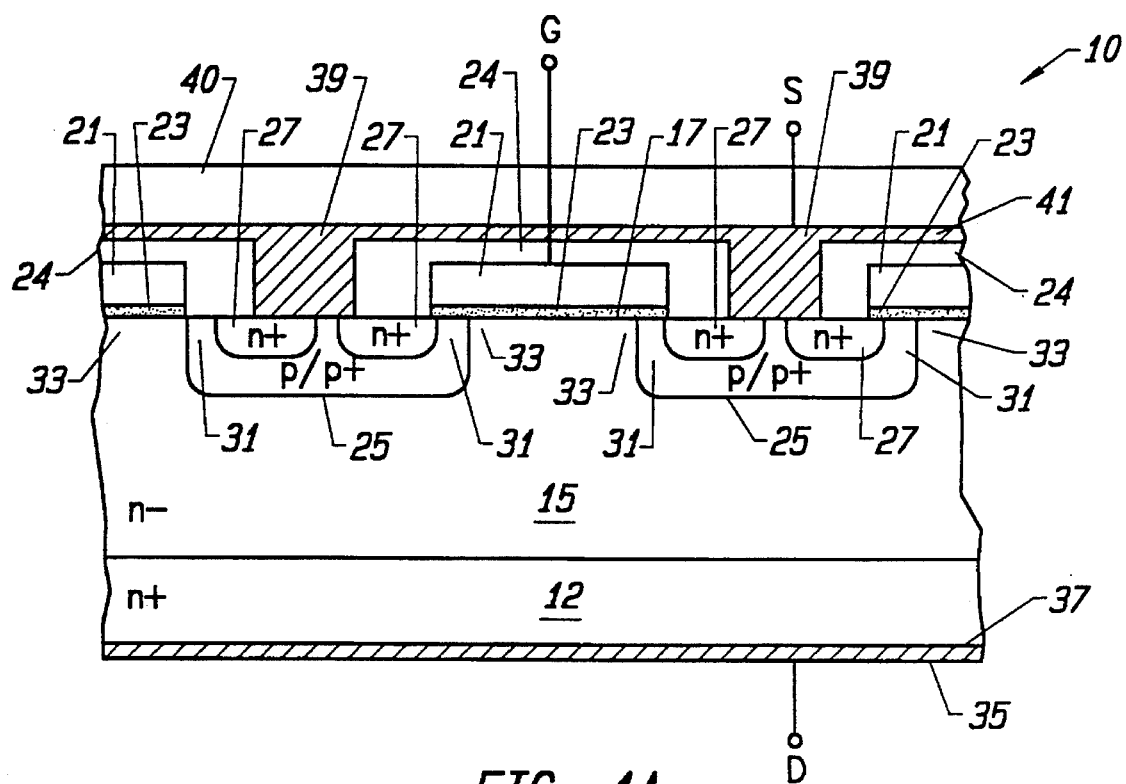
FIG. 1A is a cross-sectional view of a prior art MOSFET.

FIG. 1A is a simplified cross-sectional view of a prior art power MOSFET device 10. This device is made by a double diffused MOS process (DMOS). One typically builds this device by providing a wafer of $n^+$type conductivity 12. As shown, an $n^-$type epitaxial layer 15 is formed overlying the $n^+$type substrate. A top surface 17 is defined on this $n^-$type epitaxial layer. A gate (G) is defined as a polysilicon gate layer 21 overlying a layer of oxide 23. This polysilicon gate layer typically has a resistance of about 20 ohms/SQ. An insulating layer 24 is defined overlying the polysilicon gate layer. As shown, $p/p^+$ well regions 25 are defined within this $n^-$type epitaxial layer. A plurality of sources (S) are defined by $n^+$type source regions 27 within the $p/p^+$ type well regions. A plurality of n-channel regions 31 are defined within $p/p^+$ well regions. The channel region is adjacent to the top surface, and between the $n^+$type source region and a portion 33 of $n^-$type layer. A drain (D) is defined on the back metallization 35 overlying the backside 37 of the substrate. A portion of the top metallization layer defining source contacts 39 form a common source bus 41. The completed device also includes surface passivation 40. The source, n-channel region, drain, and gate define a power MOSFET device.

The prior art device of FIG. 1A defines each active region within a typical chip. Hundreds, thousands, or even millions of these microscopically small regions, each defining an active device, make up an active area. These devices may comprise cells which are all connected in parallel. Alternatively, these regions may comprise stripes or the like defining each active device. Typically, the gate polysilicon layer 21 of FIG. 1A which includes portions overlying the channel region and field region provides an interconnection between the individual devices, thereby producing a common gate electrode 51 as shown in FIG. 1B.

Figure 1B:
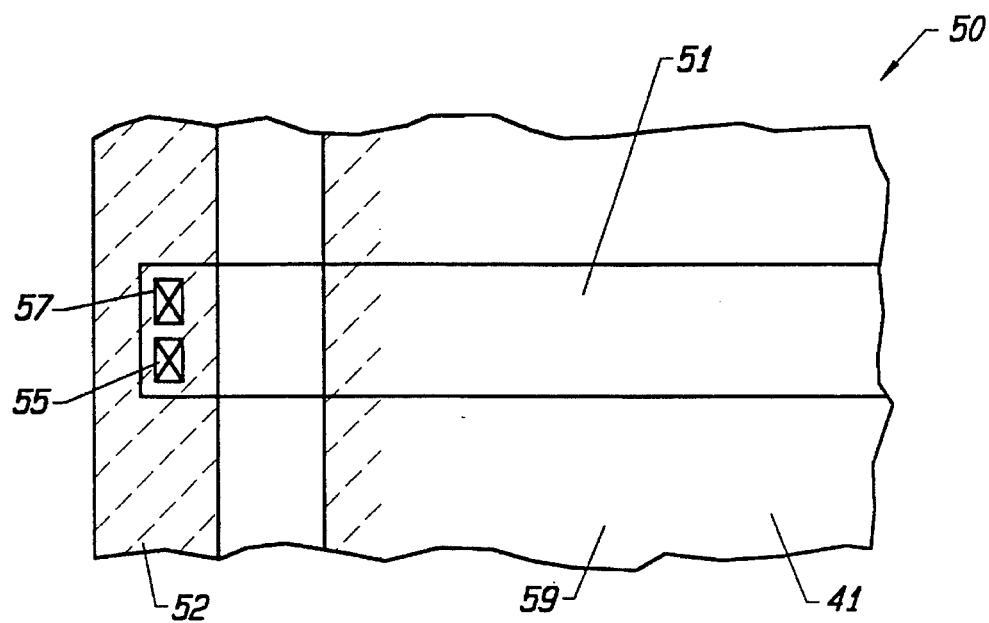
FIG. 1B is a top view showing the MOSFET of FIG. 1A with a gate bus interconnection and source metallization.

FIG. 1B is a top view 50 of the polysilicon gate electrode 51 interconnect for the prior art MOSFET device of FIG. 1A. The polysilicon gate electrode is connected to a portion of the top metallization layer comprising a gate bus 52. The gate bus is joined to the polysilicon gate electrode through contact points, or via structures, 55, 57. As shown, the top metallization layer also includes a top view of the source bus 41 of FIG. 1A overlying the active area 59 of the chip. This state-of-art prior art device relies upon this single metallization layer in combination with the resistive polysilicon layer to provide the interconnections for the chip.

Figure 1C:
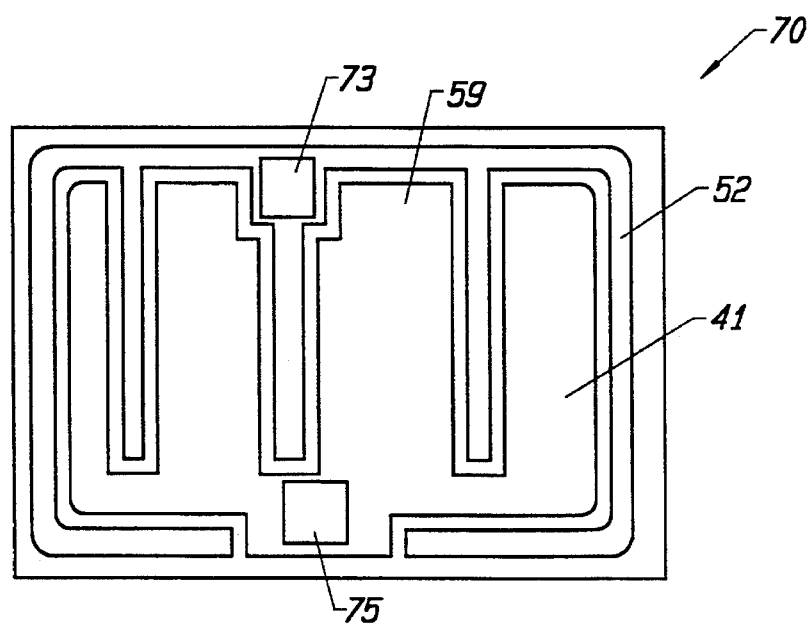
FIG. 1C is a top view showing the MOSFET of FIG. 1A in chip form.

FIG. 1C is a top view of the prior art device of FIGS. 1A and 1B forming a typical chip 70. The top metallization layer includes source bus 41 overlying the active area 59, gate bus 52 overlying non-active areas or field regions, a gate bonding pad 73, and a source bonding pad 75. The gate electrodes (not shown) are underlying the source bus within the active area of the chip. These gate electrodes are connected to the gate bus, and are therefore common to the gate bonding pad. The gate bonding pad and source bonding pad are defined within square openings of the passivation layer which is overlying the surface of the chip. As shown, the switching signal must propagate from the gate pad, through the gate bus, and then through the resistive polysilicon gate electrodes to activate or deactivate the device. This feature is governed by device layout constraints.

Layout constraints require the active area of the device to be maximized relative to any non-active or field regions. Typically, these non-active regions include the peripheral areas occupied by the guard rings, the area under the gate pad, and the area under and alongside the gate bus, and possible the area under the source pad. Since the metallization comprising the gate bus represents a non-active area, it can not consume the precious areas of the die which can be occupied by active devices. As shown, the prior art chip of FIG. 1C limits the number of gate buses. Therefore, the interconnections provided for propagating device turn-on and turn-off signals comprise primarily polysilicon instead of metallization. This characteristic creates significant problems with device performance during turn-on and turn-off.

Figure 1D:
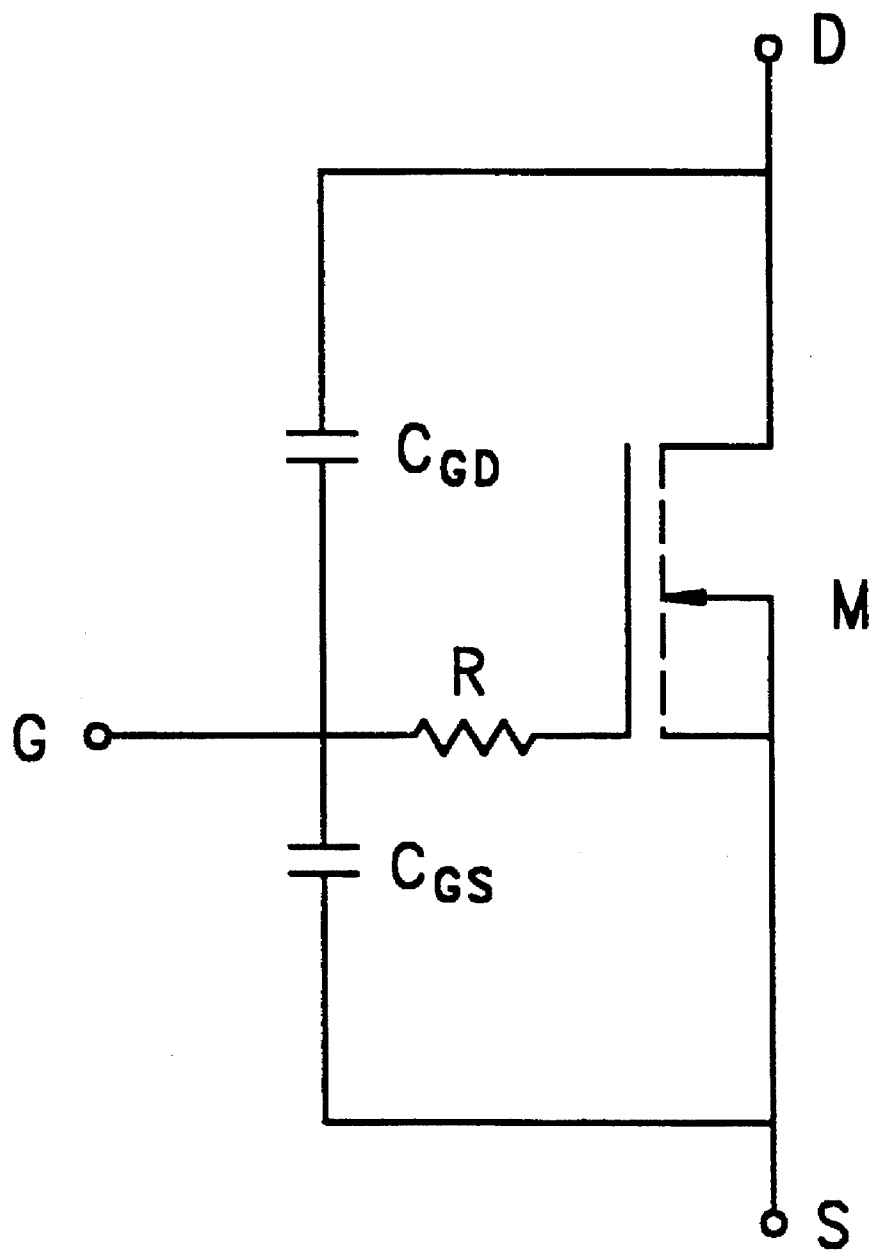
FIG. 1D is an equivalent circuit for the MOSFET of FIG. 1A.

To illustrate the effect of the polysilicon layer upon device performance, an equivalent circuit of the prior art device of FIG. 1A is shown by FIG. 1D. The n-channel MOSFET device is defined by device M. This device has three terminals including a source (S), gate (G), and drain (D), which can be reference to the device of FIG. 1A. The resistance, gate to drain capacitance, and gate to source capacitance are defined as R, $C_{GD}$, and $C_{GS}$, respectively. This combination of resistance and capacitance impairs device performance.

As represented in FIG. 1D, resistance R is inherent within the polysilicon layer of the prior art device. Typically, polysilicon has a resistance at about 20 ohms/SQ which is relatively large in reference to the metallization layer comprising aluminum. This means that the switching signal must propagate primarily through the highly resistive polysilicon layer having resistance R instead of the less resistive metallization layer.

As further illustrated, capacitance $C_{GD}$ and $C_{GS}$ represents the capacitance between the polysilicon gate region and its corresponding drain and source, respectively. This capacitance is defined as capacitance C. The combination of the resistance R and the capacitance C creates a metal bus gate having a relatively high RC value per unit length of gate. This RC value is defined as the "parasitic RC factor." The parasitic RC factor causes significant delays during device turn-on and turn-off. From the circuit of FIG. 1D, one can easily see that the signal for device turn-on and turn-off is delayed by this parasitic RC factor. In addition, resistance R within this RC factor also contributes to energy loss through heat dissipation. During high-frequency switching, energy loss leads to excessive die heating, thereby limiting the useful frequency range of the device.

Prior Art Fabrication Methods

A typical prior art DMOS fabrication process for n-channel devices may be briefly outlined as follows:

(1) Provide an n-type substrate.

(2) Grow a field oxide layer.

(3) Mask 1: Define active and ring areas.

(4) Grow a layer of gate oxide.

(5) Deposit polysilicon over the gate oxide layer and dope.

(6) Mask 2: Define the polysilicon gate area.

(7) Mask 3: Define a well region. (Optional)

(8) Implant a p-type and $p^+$type material for the well region and diffuse.

(9) Mask 4: Define a source area.

(10) Implant an n-type material for the source and diffuse.

(11) Deposit an oxide layer.

(12) Mask 5: Define contact openings for interconnections.

(13) Deposit a thick metallization layer.

(14) Mask 6: Define the thick metallization pattern.

(15) Deposit a passivation layer.

(16) Mask 7: Define bonding pads over the metallization.

(17) Deposit back metal.

As shown, the state-of-art method relies upon the single metallization layer. The method also relies upon the polysilicon layer, including portions overlying the channel region and field region, forming a common gate electrode or an interconnection between each active region.

Improved Power MOSFET Embodiments

Figure 2A:
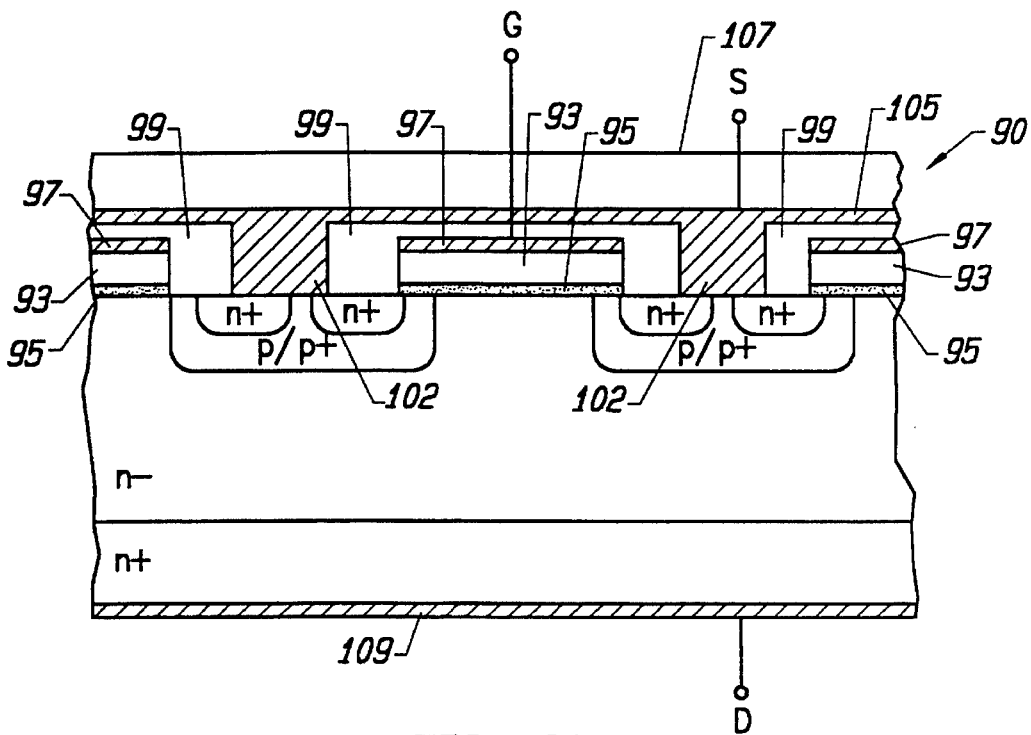
FIG. 2A is a cross-sectional view of an embodiment of the improved MOSFET device.

FIG. 2A is an embodiment of the improved power MOSFET device 90. The device may be fabricated by, for example, a DMOS process. As shown, this device relies upon n-channel technology for illustrative purposes only. Alternatively, the device may rely upon p-channel technology, or the like. The regions defining the source (S), drain (D), and channel are similar to those of the prior art device of FIG. 1A. The gate (G), however, is defined by a polysilicon gate layer 93, including portions overlying the channel and field region, on and in contact with a layer of oxide 95 and a first metallization layer 97 on and in contact with the polysilicon layer. This first metallization layer may comprise, for example, aluminum having a thickness of about 3000 angstroms. This thickness provides an efficient electrical connection between the active devices as well as allows for the uniform formation of an overlying insulating layer 99. A second metallization layer provides source contacts 102 and a common source bus 105. This second metallization layer is typically overlying at least a portion of the insulating layer, and has a thickness greater than 20,000 angstroms (typically 35,000 angstroms). The first metallization layer is connected to a portion of the second metallization layer representing a gate bus (not shown) to provide an interconnect for each active region. The completed device also includes a passivation layer 107 as well as back metallization 109.

The improved device of FIG. 2A further relies upon the processing steps as follows. To form an effective contact between the polysilicon layer and the first metallization layer the residual oxide layer must be etched from the surface of the polysilicon layer prior to metallization. This residual oxide may be etched by, for example, a non-masked oxide etch, contact mask etch, reversed polysilicon mask etch, or any other mask etch. The first metallization layer (typically aluminum) is then sputtered over the polysilicon layer. Subsequently, a low temperature oxide, gas dielectric, polyimide, or any other insulator requiring deposition, densification, or curing, at temperatures less than about 450° C. is deposited over the first metallization layer. The thickness of this insulating layer may be about 10,000 angstroms. The second metallization layer is applied to provide the interconnections for the device similar to that of the prior art. The second metallization layer has a gate bus connecting the first metallization layer to a common gate pad. To prevent the possibility of shorting the gate electrode with source metallization, the first metallization layer should be at least 3μ from any source contact area. However, for efficient processing as well as improved device performance, the first metallization layer is covering the entirety of the surface of the polysilicon layer.

Figure 2B:
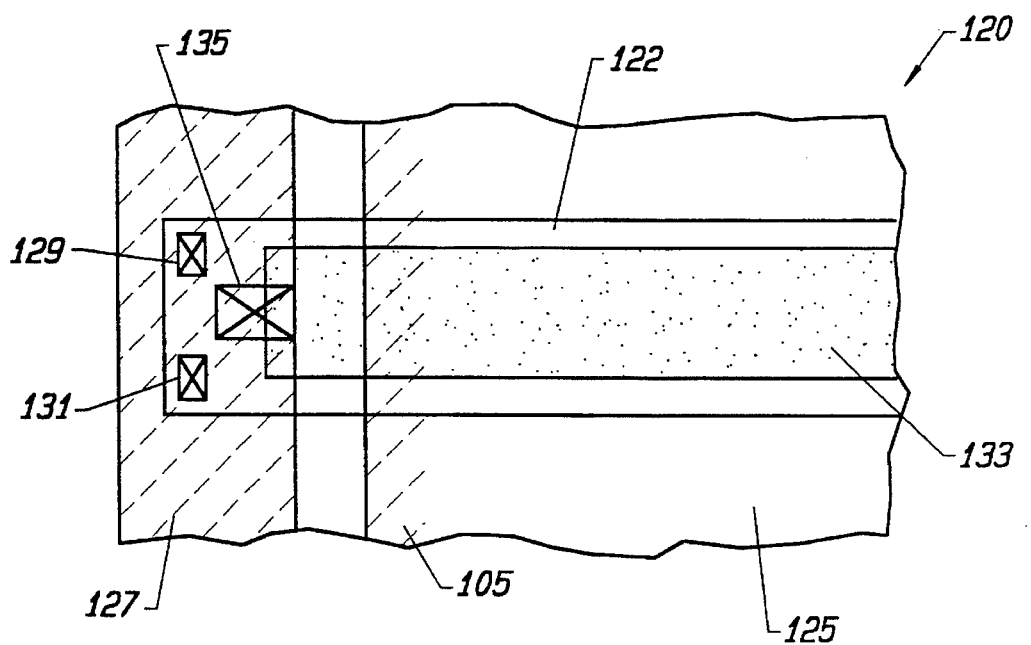
FIG. 2B is a top view showing the MOSFET of FIG. 1B with a gate bus interconnection and source metallization.

FIG. 2B is a top view showing an interconnections 120 for the improved device of FIG. 2A. The polysilicon layer 93 of FIG. 2A forms the common gate electrode 122 in FIG. 2B within the active area 125 of the chip. As shown, the second metallization layer includes the source bus 105, gate bus 127, and contacts 129, 131 between the gate bus and underlying polysilicon gate electrode. The improvement is shown by the first metallization layer 97 of FIG. 2A forming the top view of the first metallization layer 133 of FIG. 2B. As shown, this first metallization layer is overlying the polysilicon gate electrode. This polysilicon gate electrode includes, for example, portions overlying the channel and field region. The contact point between the first metallization layer and the gate bus portion of the second metallization layer is defined by contact point, or via structure 135. This contact point 135 has an overlarged aperture opening to clear out any insulating material within the opening. The interconnects for the improved device relies upon the prior art contact points 129, 131 as well as the contact point 135 between the first metallization layer and the portion of the second metallization layer representing the gate bus. FIG. 2B shows, for example, a single contact point between the first and second metallization layer. Alternatively, the device may rely upon multiple contact points (or via structures) between the first and second metallization layer for each gate electrode.

With the improved structure, the turn-on or turn-off signal propagates from the gate pad through the gate bus portion of the second metallization, through the first metallization layer, and then to each active device. These signals are propagating primarily through metallization instead of the resistive polysilicon layer of the prior art. The improved device provides, for example, overall resistance values at about 1% of resistance R of the prior art. Capacitance is also reduced by 50% over the prior art. Thus, resistance R and capacitance C, and therefore the RC factor inherently decrease, thereby providing a more efficient turn-on and turn-off.

The improved device relies upon this combination of the first and second metallization layer for facilitating device turn-on and turn-off. The signal propagates from the metal gate pad through the metal gate bus (or portion of second metallization layer), and then through the first metallization layer to turn-on or turn-off the device. Since the signal propagates substantially through metallization rather than the resistive polysilicon layer of the prior art, switching performance is improved. The combined resistivity and capacitance of the first and second metallization layers in the improved device is relatively small to resistance R and capacitance C of the prior art. Typically, the improved device provides an overall resistance of about 1% and a capacitance of about 50% in reference to the prior art. Therefore, the delays caused by the RC factor are reduced over the prior art during device turn-on and turn-off. In addition, the present invention also reduces the amount of heat dissipated, and therefore energy loss. Furthermore, at high frequency operation (typically 1 MHz to 900 MHz), less heat is dissipated from the improved device which allows it to operate over a broader range of frequencies.

Improved Power MOSFET Fabrication Methods

A DMOS fabrication method for the improved power MOSFET device may, for example, be outlined beginning from the prior art fabrication method shown above. The outline provides the steps for fabricating an n-channel device for illustrative purposes. As shown, the present invention relies upon the first nine steps (9) shown above. After step (9), the processing steps are as follows:

(10) Implant or dope n-type material into the source area and diffuse.

(11) Etch off residual oxide over the polysilicon layer by a non-masked oxide etch, contact etch, reversed polysilicon mask etch, or the like.

(12) Deposit a first metallization layer over the polysilicon to a desired thickness. This first metallization layer may be, for example, aluminum.

(13) Mask 5: Define the first metallization layer.

(14) Deposit a low temperature oxide, any other desired glass dielectric or polyimide, or the like where deposition, densification, or curing, does not exceed 450° C. This temperature limitation is designed to protect the aluminum.

(15) Mask 6: Define a contact mask which includes apertures for the gate contacts to the polysilicon gate and the first metallization.

(16) Deposit the second metallization layer forming the source contacts, gate pad, and bus layer.

(17) Mask 7: Define the second metallization pattern.

(18) Deposit a passivation layer.

(19) Mask 8: Define bonding pads.

(20) Deposit back metallization.

After deposition of the first metallization layer, further processing is done at temperatures at or below 450° C. to prevent damage to the metallization comprising aluminum. This first metallization layer is at a thickness of about 3000 angstrome which is thin relative to the thickness of the second metallization layer (greater than 20,000 angstroms, and typically 35,000 angstrome). The thickness of the first metallization layer provides an efficient electrical connection as well as allows for the uniform formation of an overlying layer. The first metallization layer is also at least 3μ from any source contact area to prevent shorting with the second metallization layer. As shown, the improved method relies upon two metallization layers to provide improved switching characteristics. The improvement occurs because the turn-on and turn-off signal must propagate primarily through a medium comprising substantially metallization instead of the resistive polysilicon layer of the prior art. As such, resistance R, capacitance C, and the RC factor inherently decrease. As discussed above, benefits of the improved device include faster and more efficient device turn-on and turn-off, lower energy consumption and therefore less heating, and more efficient operation over a broader range of frequencies.

While the above is a full description of the specific embodiments, various modifications, alternative constructions and equivalents may be used. For example, while the description above is in terms of a n-channel device, it would be possible to implement the present invention with a p-channel device, or the like. The embodiments shown may comprise, for example, cells which are all connected in parallel. Alternatively, these regions may comprise stripes or the like defining the active device.

Therefore, the above description and illustrations should not be taken as limiting the scope of the present invention which is defined by the appended claims.

What is claimed is:

1. A power MOSFET device comprising:

a plurality of active MOS regions within a semiconductor substrate, each of said active MOS regions having a source region, channel region, and drain region;

a polysilicon layer overlying said semiconductor substrate, said polysilicon layer having a portion overlying at least each of said channel regions to form a common gate electrode;

a first metallization layer comprising aluminum having portion overlying said polysilicon layer overlying each of said channel regions;

an insulating layer on and in contact with said first metallization layer; and a second metallization layer comprising a gate bus and a source bus overlying at least said insulating layer, said second metallization layer further comprising aluminum;

wherein said first metallization layer and said gate bus are common to each other through a gate contact opening in at least said insulating layer.

2. The power MOSFET device of claim 1 wherein said first metallization layer has a thickness of about 3000 angstroms.

3. The power MOSFET device of claim 1 wherein said first metallization layer is at least 3 microns from a source contact area to prevent shorting to said second metallization layer and is substantially covering said polysilicon layer.

4. The power MOSFET device of claim 1 wherein said insulating layer can be selected from a group consisting of a low temperature oxide, gas dielectric, or polyimide.

5. The power MOSFET device of claim 1 wherein said insulating layer is formed at temperatures less than about 450° C.

6. The power MOSFET device of claims 5 wherein said insulating layer has a thickness of about 10,000 angstroms.

7. The power MOSFET device of claim 1 wherein said gate electrode is common to said second metallization layer through contact openings in at least said insulating layer.

8. A power MOSFET device comprising:

a plurality of active MOS regions within a semiconductor substrate each of said active MOS regions having a source region, channel region, and drain region;
a polysilicon layer overlying said semiconductor substrate, said polysilicon layer having a portion overlying at least each of said channel regions and a field region to form a plurality of common gate electrodes;

a first metallization layer comprising aluminum having a portion substantially overlying each of said common gate electrodes wherein said first metallization layer is at least 3 microns from a source contact area;

an insulating layer on and in contact with said first metallization layer; and a second metallization layer comprising a gate bus and a source bus overlying at least said insulating layer, said second metallization layer further comprising aluminum;

wherein said first metallization layer and said gate bus are common to each other through a gate contact opening in at least said insulating layer.

9. The power MOSFET device of claim 8 wherein said first metallization layer has a thickness of about 3000 angstroms.

10. The power MOSFET device of claim 8 wherein said insulating layer can be selected from a group consisting of a low temperature oxide, gas dielectric, or polyimide.

11. The power MOSFET device of claim 8 wherein said insulating layer is formed at temperatures less than about 450° C.

12. The power MOSFET device of claims 10 or 11 wherein said insulating layer has a thickness of about 10,000 angstroms.

13. The power MOSFET device of claim 8 wherein each of said common gate electrodes are common to said second metallization layer through contact openings in at least said insulating layer.

14. A method of fabricating a power MOSFET device comprising the steps of:
   providing a semiconductor substrate with a plurality of active MOS regions each having a source region, channel region, and drain region;
   forming a polysilicon layer overlying at least said channel regions to form a plurality of common gate electrodes;
   forming a first metallization layer comprising aluminum overlying said semiconductor substrate and said polysilicon layer;
   defining said first metallization layer to form a portion overlying said polysilicon layer;
   forming an insulating layer on and in contact with said first metallization layer; and
   forming a second metallization layer overlying at least said insulating layer, said second metallization layer including a gate bus common to said first metallization layer through a gate contact opening in at least said insulating layer.

15. The method of claim 14 further comprising a step of etching off a residual oxide layer overlying said polysilicon layer prior to said step of forming said first metallization layer.

16. The method of claim 14 wherein said step of etching can be selected from a group consisting of a non-masked oxide etch, contact etch, or reversed polysilicon mask etch.

17. The method of claim 14 wherein said first metallization layer has a thickness of about 3000 angstroms.

18. The method of claim 14 wherein said first metallization layer is at least 3 microns from a source contact area to prevent shorting to said second metallization layer.

19. The method of claim 14 wherein said insulating layer can be selected from a group consisting of a low temperature oxide, gas dielectric, or polyimide.

20. The method of claim 14 wherein said step of forming an insulating layer is performed at a temperature not exceeding 450° C.

21. The method of claims 19 or 20 wherein said insulating layer has a thickness of about 10,000 angstroms.

22. The power MOSFET device of claim 14 wherein each of said common gate electrodes are common to said second metallization layer through contact openings in at least said insulating layer.

23. A high frequency power MOSFET device comprising:
   a polysilicon layer having at least a portion overlying a MOSFET channel region;
   a first metallization layer comprising aluminum having a portion overlying a portion of said polysilicon layer;
   an insulating layer overlying said first metallization layer;
   a second metallization layer comprising a gate bus overlying said insulating layer, said second metallization layer further comprising aluminum; and
   wherein said first metallization layer and said gate bus are interconnected through at least a first contact opening in said insulating layer.

24. The high frequency power MOSFET device of claim 23 wherein said first metallization layer has a thickness of about 3000 angstroms.

25. The high frequency power MOSFET device of claim 23 wherein said first metallization layer is at least 3 microns from a source contact area to prevent shorting to said second metallization layer.

26. The high frequency power MOSFET device of claim 23 wherein said insulating layer can be selected from a group consisting of a low temperature oxide, gas dielectric, or polyimide.

27. The high frequency power MOSFET device of claim 23 wherein said insulating layer is formed at temperatures less than about 450° C.

28. The high frequency power MOSFET device of claims 26 or 27 wherein said insulating layer has a thickness of about 10,000 angstroms.

29. A high frequency power MOSFET device of claim 23 wherein said polysilicon layer is in common to said second metallization layer through at least a second contact opening in said insulating layer.

30. A high frequency power MOSFET device of claim 23 wherein said device operates between about 1 MHz to 900 MHz.

* * * * *